United States Patent [19]

Takayanagi et al.

[11] Patent Number: 5,203,929
[45] Date of Patent: Apr. 20, 1993

[54] METHOD OF PRODUCING AMORPHOUS MAGNETIC FILM

[75] Inventors: Noboru Takayanagi; Kazuhiro Akihama, both of Aichi, Japan

[73] Assignee: Toyota Jidosha Kabushiki Kaisha, Toyota, Japan

[21] Appl. No.: 721,320

[22] Filed: Jun. 26, 1991

[30] Foreign Application Priority Data

Jul. 24, 1990 [JP] Japan .................................. 2-196929
Feb. 13, 1991 [JP] Japan .................................. 3-20199

[51] Int. Cl.$^5$ ............................................ H01F 41/22
[52] U.S. Cl. .................................. 148/121; 148/525; 427/559; 427/597
[58] Field of Search ................ 427/42, 53.1, 130, 559, 427/597; 148/101, 121, 304, 525

[56] References Cited

U.S. PATENT DOCUMENTS

| | | | |
|---|---|---|---|
| 4,469,536 | 9/1984 | Forester | 148/403 |
| 4,512,824 | 4/1985 | Taub | 148/121 |
| 4,634,306 | 1/1987 | Dzuik | 148/403 |
| 4,812,181 | 3/1989 | Hilzinger et al. | 148/121 |
| 4,851,296 | 7/1989 | Tenhover et al. | 428/457 |
| 4,950,337 | 8/1990 | Li et al. | 148/121 |
| 5,015,492 | 5/1991 | Venkatesan et al. | 427/8 |

FOREIGN PATENT DOCUMENTS

| | | |
|---|---|---|
| 0132907 | 2/1985 | European Pat. Off. . |
| 0134653 | 3/1985 | European Pat. Off. . |
| 3800680 | 7/1989 | Fed. Rep. of Germany . |
| 54-51919 | 4/1979 | Japan . |
| 63-241135 | 10/1988 | Japan . |
| 2016528 | 9/1979 | United Kingdom . |
| 2155042 | 9/1985 | United Kingdom . |

OTHER PUBLICATIONS

Japanese Journal of Applied Physics, vol. 17, No. 10, Oct. 1978, pp. 1755–1763, T. Miyazaki, et al., "Magnetic Annealing Effect of Amorphous $(Fe_{1-x}Co_x)_{77}Si_{10}B_{13}$ Alloys".
Japanese Journal of Applied Physics, vol. 20, No. 4, Apr. 1981, pp. 727–731, S. Tsunashima, et al., "Properties of Amorphous Iron-Metalloid Thin Films".
IEEE Transactions on Magnetics, vol. Mag-23, No. 5, Sep. 1987, M. Hayakawa, et al., "Soft Magnetic Properties of Crystalline High Bs Fe–Co–Si and Fe–Co–Si–Al Sputtered Films".
Soviet Physics Doklady, vol. 29, No. 10, Oct. 1984, New York, US, pp. 844–845; Shakow et al; Structure of Amorphous Fe-Based Alloy Films Condensed from the Products of Laser Erosion, p. 844, col. 1, line 19–line 33.
J. Appl. Phys., 64, (10), Nov. 15, 1988, pp. 6053–6055, J. L. Wallace, "Amorphous Fe–B–Si Magnetic Films by Reactive Sputtering from a Pure Iron Source".
"Amorphization of iron and chromium in laser evaporation", Chemical Abstracts, vol. 110 (119365c), 1989, p. 294, A. G. Kosevich et al.

*Primary Examiner*—George Wyszomierski
*Attorney, Agent, or Firm*—Oblon, Spivak, McClelland, Maier & Neustadt

[57] ABSTRACT

An amorphous magnetic film is produced by irradiating laser beams onto a magnetic metallic target and depositing an evaporated material on a substrate. During or after the evaporation process, the film formed on the substrate is annealed at a temperature lower than a crystallization temperature. The annealing process enables elimination of stresses from the film, thereby improving soft magnetic properties.

4 Claims, 16 Drawing Sheets

TARGET POTENTIAL; 0V
SUBSTRATE TEMPERATURE; ROOM TEMPERATURE
As depo. (AFTER VACUUM EVAPORATION)

TARGET POTENTIAL; 300V
SUBSTRATE TEMPERATURE; ROOM TEMPERATURE
As depo. (AFTER VACUUM EVAPORATION)

TARGET POTENTIAL; 300V
SUBSTRATE TEMPERATURE; ROOM TEMPERATURE
300°C x 30min (ANNEALING)

TARGET POTENTIAL; 0V
SUBSTRATE TEMPERATURE; 200°C
As depo. (AFTER VACUUM EVAPORATION)

METHOD OF PRODUCING AMORPHOUS MAGNETIC FILM

BACKGROUND OF THE INVENTION

1. Field of the Invention

This invention relates to a method of producing an amorphous magnetic film, and more particularly to a method in which a laser beam is irradiated to a magnetic metal target so as to generate an evaporant which is deposited on a substrate so as to form a magnetic film having a composition identical to that of the target.

2. Description of Related Art

Heretofore magnetism has been widely applied to fields such as data recording and remote controlling. Specifically, magnetic thin films have been very important for improving functions of magnetic recording devices and magnetic sensors, for example. Various attempts and studies have been made in order to improve such magnetic thin films.

Among a variety of magnetic thin films, amorphous magnetic films have been known which demonstrate such excellent properties as a high magnetic permeability, a small coercive force, and a small magnetic anisotropy. Therefore use of the amorphous magnetic films enables acceleration of the data recording and precise detection of magnetism. These films have been considered optimum as a component not only for magnetic recording materials but also for torque sensors and pressure sensors which make use of the magnetism.

Both of the coercive force and magnetic anisotropy strongly depend upon a degree of crystallinity of materials. The higher crystallinity of the materials, the larger the coercive force and magnetic anisotropy. When the amorphous magnetic film has high degree of amorphousness, both of the coercive force and magnetic anisotropy can be decreased. In addition, since the magnetic permeability also depends upon the composition of the magnetic film materials, it is necessary to control the composition of the films accurately.

Such amorphous magnetic films have been produced by methods such as vacuum evaporation and sputtering according to kinds of thin films to be produced.

With the vacuum evaporation method, a thin film is deposited on a substrate by evaporation from a target consisting of a magnetic material, and is heated in a vacuum by a heater, for example. With the sputtering method, plasma of inert gas such as argon is formed in a chamber so as to irradiate plasma particles (ions) to a target, eject atoms or molecules from the surface of the target, and deposit the atoms or molecules on a substrate.

With these methods, an amorphous magnetic film is produced on the surface of the substrate as desired when the target has a predetermined composition and a speed for cooling the thin film on the substrate is determined at a value not to cause crystallization.

Generally the amorphous magnetic films have magnetic permeability, coercive force, magnetic anisotropy, magnetic distortion and so forth which vary with components and composition of the materials. The component and composition of the amorphous magnetic films are determined according to the field of application.

Therefore it is essential to produce an amorphous magnetic film whose component and composition are suitable to demonstrate desired magnetic properties.

When producing amorphous magnetic films by a conventional vacuum evaporation method, it is required to heat and evaporate a plurality of metallic atoms.

In such a case, it is conceivable to use an alloy target and to evaporate metallic atoms in the alloy. Since the metallic atoms composing the alloy have however different vapor pressures, it is very difficult to produce an alloy film having a desired composition. Specifically, when metals composing the alloy are separately heated by multiple-independent sources, composition of an evaporated film can be controlled as desired, but a device therefore becomes large inevitably.

In the vacuum evaporation method, a thin metallic film is deposited by evaporation from a heated target material. Evaporated particles reaching the substrate have a small kinetic energy, taking a considerable time to be cooled to the temperature of the substrate. Therefore, only limited magnetic metals or magnetic alloys can be made amorphous. In addition, the kinetic energy of the particles reaching the substrate is too small to stick the deposited film to the substrate reliably.

Many of existing amorphous magnetic films are usually made of alloys which can become amorphous at a relatively low cooling speed.

With the sputtering method, ions, which are generated by plasma or discharge of gas such as argon, are irradiated onto a target so as to evaporate the target material. This method is not applicable in a high vacuum, being disadvantageous in that impurities in a deposited film cannot be removed sufficiently. Specifically, impurities in the inert gas or the inert gas itself often mix in the deposited film. In such a case, the amorphous magnetic film cannot have the desired composition and cannot maintain the desired magnetic properties.

When producing an amorphous magnetic alloy film, it is required to use an alloy target whose composition is identical to that of a film to be produced. However the amount of atoms to be sputtered by inert gas varies with the atoms. In addition, ratios of the sputtered particles reaching the substrate depend upon the kinds of atoms. Therefore the composition of a deposited thin film sometimes differs from the composition of the target, thereby making it impossible to obtain a film having the desired properties.

With the sputtering method, a kinetic energy of particles to be deposited on the substrate is large compared with that of the vacuum evaporation method, so that the film can stick to the substrate closely. However since a temperature of the substrate is raised by plasma or discharge of the inert gas, a sufficient cooling speed cannot be attained. Only limited magnetic metals or alloys can be made amorphous.

In the foregoing methods, it is required to know the difference of compositions between the target and a film to be produced so as to obtain an amorphous magnetic film of the desired composition.

SUMMARY OF THE INVENTION

It is therefore an object of this invention to provide a method of producing an amorphous magnetic film so as to solve problems of convention methods. The proposed method can offer amorphous magnetic metallic or alloy films, which have a minimized difference of composition from the target, and an increased amorphousness, a reduced coercive force and improved soft magnetic properties.

According to this invention, there is provided a method for producing an amorphous magnetic film comprising: disposing a target consisting of a magnetic metal and a substrate in a confronting manner in a high vacuum chamber; irradiating laser beams to a surface of the target so as to evaporate a target material; depositing the evaporated target material on the substrate so as to produce a thin film on the substrate; and annealing the thin film on the substrate at a temperature lower than a crystallization temperature of the thin film.

With this method, while the substrate is maintained at a temperature below the crystallization temperature of the film, laser beams are irradiated on the surface of the target so as to evaporate the target material, thereby depositing the evaporated target material on the substrate.

According to the invention, the laser beams are irradiated to the target disposed in the vacuum chamber so that part of the target is evaporated, being deposited densely on the substrate so as to produce a thin film thereon. The laser beams can concentrate energy densely on the target, being able to evaporate respective components of the target instantly. In addition, since the target can be evaporated in an high vacuum, the produced film is free from impurities, being identical to the composition of the target. An alloy target including a multiplicity of atoms having different vapor pressures can be used to produce an optimum amorphous magnetic alloy film by use of a simple device.

The speed and temperature (energy) of the evaporated materials are high compared with those of conventional methods. Therefore, a cooling speed (for lowering the temperature of the evaporated materials to a room temperature) on the substrate can be accelerated, so that an amorphous magnetic film having a large adhesion strength can be produced.

Since the target and the substrate are independently heated, the substrate is not exposed to the plasma contrary to the sputtering method, thereby keeping the substrate temperature constant. The temperature of the film can be controlled independently of the film making conditions such as pulse irradiating condition to the target.

This feature allows establishment of optimum conditions for eliminating residual stresses, which are one of the most serious causes to deteriorate soft magnetic properties of the films, by heating the film independently from the film making conditions.

According to this invention, the magnetic metallic film formed on the substrate is annealed at a temperature below the crystallization temperature, or the substrate is heated and maintained at a temperature below the crystallization temperature when an amorphous magnetic metallic film or an amorphous magnetic alloy film is being formed on the substrate. Therefore residual stresses can be eliminated from the amorphous magnetic metallic film or amorphous magnetic alloy film. In this case, the film being formed is maintained at a predetermined temperature contrary to the sputtering method. This feature is very effective to produce good amorphous magnetic soft films since optimum conditions for heating the films to eliminate stresses can be established as desired.

DETAILED DESCRIPTION

A method of producing an amorphous magnetic film will be described with reference to the accompanying drawings.

Figure 1:
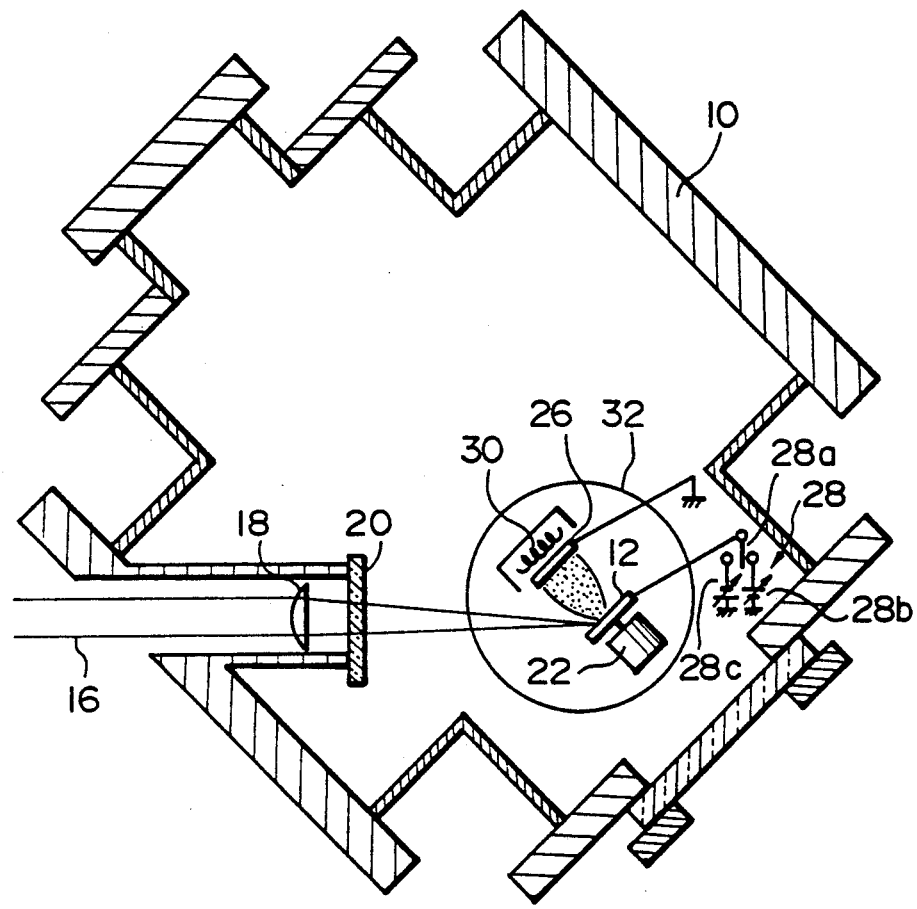
FIG. 1 is a diagrammatic view of a device for producing an amorphous magnetic film according to first embodiment of this invention.
Figure 2:
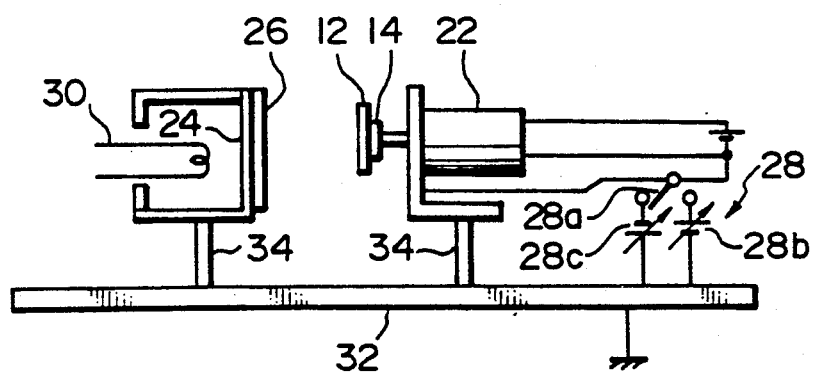
FIG. 2 is a partially enlarged view of FIG. 1.

FIGS. 1 and 2 show a device suitable to produce an amorphous magnetic film according to a method of this invention.

A chamber 10 is evacuated by a non-illustrated vacuum pump. A target 12 as an evaporant material for an amorphous magnetic film is placed on a target holder 14 in the chamber 10. A non-illustrated laser beam emitter irradiates laser beams 16 to the target 12 through a condenser 18 and a transparent opening cover 20. Then the evaporant materials are evaporated from the target 12. A DC motor 22 is connected to the target holder 14 so that the target 12 is rotated at a predetermined speed, thereby preventing the target 12 from being damaged thermally by the irradiated laser beams.

A substrate holder 24 is disposed in front of the target holder 14 with a predetermined space. Particles evaporated from the target 12 are deposited on a substrate 26 mounted on the substrate holder 24, thereby producing a thin film.

The substrate holder 24 is grounded while the target holder 14 is connected to a DC power supply 28 so as to apply a predetermined potential difference between the substrate holder 24 and the target holder 14, thereby improving amorphousness. Specifically, the DC power supply 28 includes a selector switch 28a, a positive variable source 28b and a negative variable source 28c, maintaining the target at a desired potential.

A positive potential repels evaporants from the target 12 and having the negative charge, but accelerates those having the positive charge. On the contrary, a negative potential accelerates the evaporants having the negative charge, but repels those having the positive charge. Application of either the negative or positive potential increases energy or a cooling speed of either positively- or negatively-charged particles in the evaporants. Accelerated charged-particles decompose chemical bonding of a deposited film, implanting into the film, and improving amorphousness of the film by disturbing orientations of atoms.

According to the invention, since the target and the substrate are heated separately and the substrate is not exposed to plasma contrary to the sputtering method, the substrate is free from temperature rise. Therefore, the temperature of the film can be independently controlled regardless of film making conditions such as pulse application to the target.

This feature allows establishment of optimum conditions for eliminating residual stresses, which are one of the most serious causes to deteriorate soft magnetic properties of the films, by heating the film independently from the film making conditions.

A heater 30 is disposed behind the substrate holder 24 so as to heat the substrate 26 and a film deposited on the substrate 26. The amorphous magnetic metallic or alloy film deposited on the substrate 26 is annealed continuously at a temperature below the crystallization temperature. Otherwise the substrate 26 is heated and maintained at a temperature below the crystallization temperature while the film is being formed.

Annealing of the film or heating of the substrate eliminates the residual stresses from the amorphous magnetic metallic or alloy film on the substrate 26, further improving soft magnetic properties of the magnetic films such as coercive force, magnetic anisotropy, magnetic permeability and hysterisis.

As shown in FIG. 2, both of the substrate holder 24 and the target holder 14 are disposed on a positioning rotary stage 32 via an insulator 34. Therefore, an angle for irradiating the target 14 with the laser beams 16 can be changed.

Films were experimentally produced by the foregoing device as described below. Glass was used as the substrate 26.

Basic Experimental Example 1

A target 12 of $Fe_{75}Si_8B_{17}$ was mounted on the target holder 14 in the chamber 10, which was evacuated to a pressure of $1 \times 10^{-5}$ Torr or less.

The potential of the target holder 14 was set for 0 V. As an evaporating laser beam 16, KrF excimer laser, which can generate a high output and has a high energy absorption for metals, was irradiated for 2,000 seconds to the target 12 rotating at 10 rpm. The excimer laser has a wavelength of 249 mm, pulse width of 16 nsec, pulse frequency of 50 pulses/sec, and pulse energy of 250 mJ. An irradiating angle was about 45° for the normal of the holder plane, and an irradiating power density was about 10 $J/cm^2$. Thus an amorphous magnetic film was formed on the glass substrate 26 having a room temperature.

Figure 3:
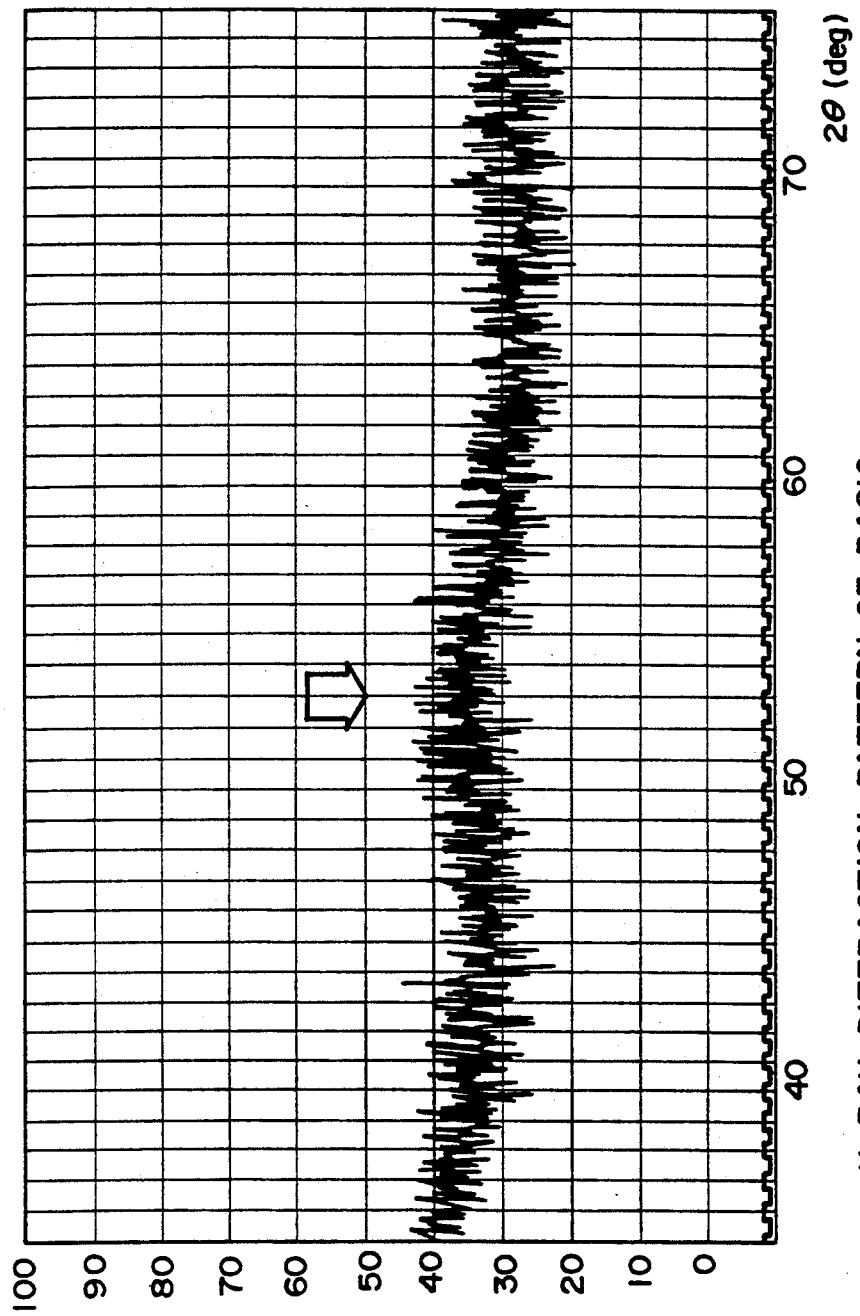
FIG. 3 shows an X-ray diffraction pattern of an amorphous magnetic film in Basic Experimental Example 1.
Figure 4:
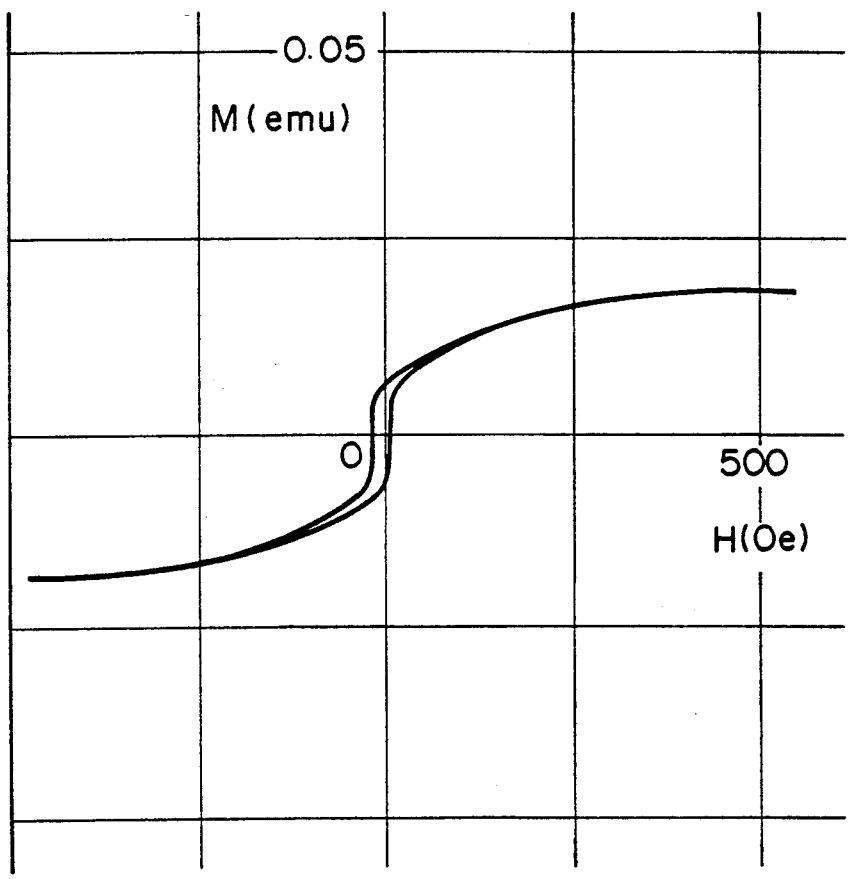
FIG. 4 is shows a magnetization curve (M-H curve) of the amorphous magnetic film of Basic Experimental Example 1.

FIG. 3 shows an X-ray diffraction pattern of the amorphous magnetic film produced for the Basic Experimental Example 1. FIG. 4 shows a curve of magnetization (M-H) measured by a VSM (specimen-vibrating type magnetometer). It can be seen from FIG. 3 that the X-ray diffraction pattern is a broad pattern which is peculiar to the amorphous state. It is understood from FIG. 4 that the amorphous magnetic film has soft magnetism with the coercive force of 11 (Oe).

The produced film has a large adhesion strength. The film was analyzed concerning its composition by using an XPS. The composition of the film was substantially identical with that of the target.

Specifically, a composition of boron (atomic weight B=10.81, Fe=55.81) has been maintained in good state. Boron is difficult to maintain its composition with an ordinary sputtering method.

Basic Experimental Example 2

A target 12 of $Fe_{75}Si_8B_{17}$ was mounted on the target holder 14 in the chamber 10, which was evacuated to a pressure of $1 \times 10^{-5}$ Torr or less.

A potential of 300 V was applied to the target holder 14. As an evaporating laser beam 16, KrF excimer laser identical to that in the basic Experimental Example 1) was irradiated for 2,000 seconds to the target 12 rotating at 10 rpm. An irradiating angle was about 45° for the normal of the holder plane, and an irradiating power density was about 10 $J/cm^2$. Thus an amorphous magnetic film was formed on the glass substrate 26 having the room temperature.

Figure 5:
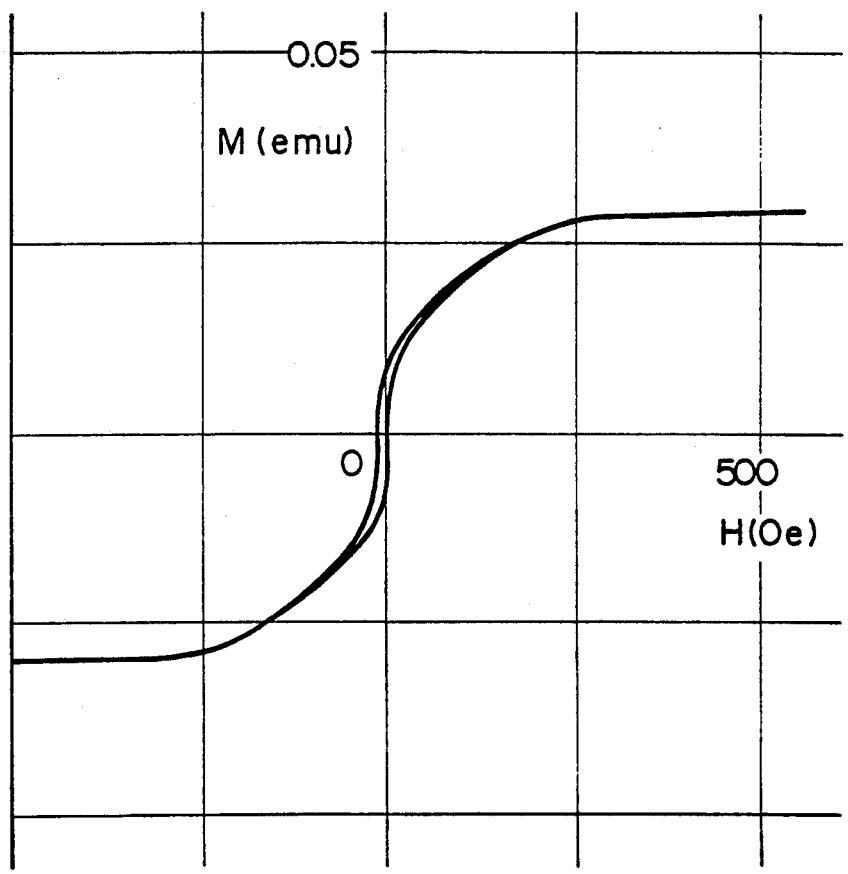
FIG. 5 shows an M-H curve of an amorphous magnetic film in Basic Experimental Example 2.

FIG. 5 shows a curve of magnetization (M-H) of the amorphous magnetic film of this example. It can be seen from FIG. 5 that the coercive force is 7.5 (Oe), and that application of the voltage has improved the amorphousness and the soft magnetic properties but reduced the coercive force. A film produced by applying a voltage of −300 V showed an M-H curve similar to that shown in FIG. 5, and had the coercive force of 7.5 (Oe). In addition, an X-ray diffraction pattern of the film was broad similarly to that shown in FIG. 3.

The produced films have excellent magnetic properties including very small coercive force. They have a large adhesion strength. The compositions of the films were substantially identical with those of the target through analysis using an XPS.

Experimental Example 1-1

A target 12 of $Fe_{75}Si_8B_{17}$ was mounted on the target holder 14 in the chamber 10, which was evacuated to a pressure of $1 \times 10^{-5}$ Torr or less.

The potential of the target holder 14 was set for 0 V. As an evaporating laser beam 16, KrF excimer laser (identical to that of the basic Experimental Example 1) was irradiated for 2,000 seconds to the target 12 rotating at 10 rpm. An irradiating angle was about 45° for the normal of the holder plane, and an irradiating power density was about 10 $J/cm^2$. Thus an amorphous magnetic film was formed on the glass substrate 26 having the room temperature. A crystallization temperature of the film was 550° C.

Then the film was annealed in the vacuum for 30 minutes by keeping the substrate 26 at 200° C. below 550° C. by a heater 30.

Figure 6:
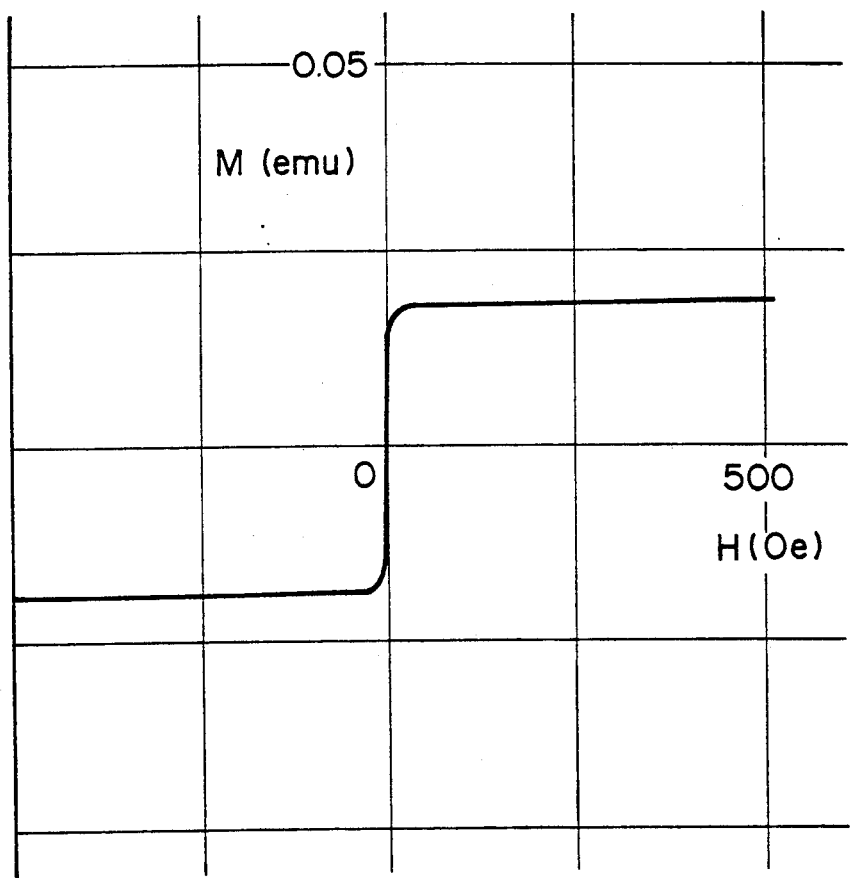
FIG. 6 shows an M-H curve of an amorphous magnetic film in Basic Experimental Example 1-1.
Figure 7:
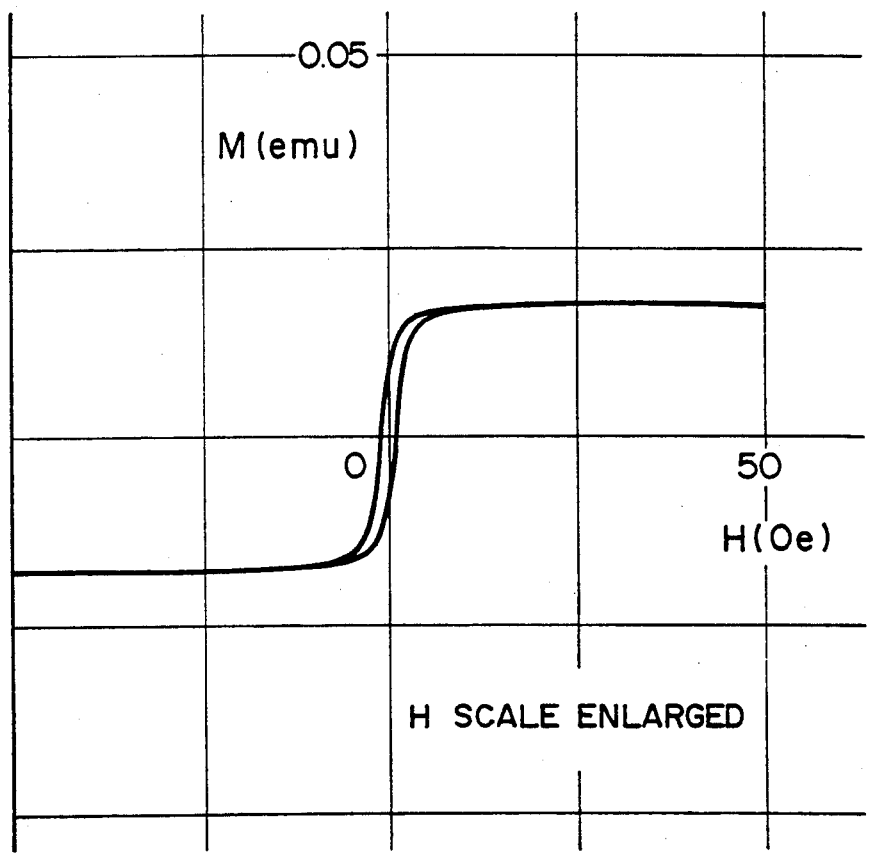
FIG. 7 shows the M-H curve of an amorphous magnetic film in Basic Experimental Example 1-1 (with H scale enlarged)
Figure 8:
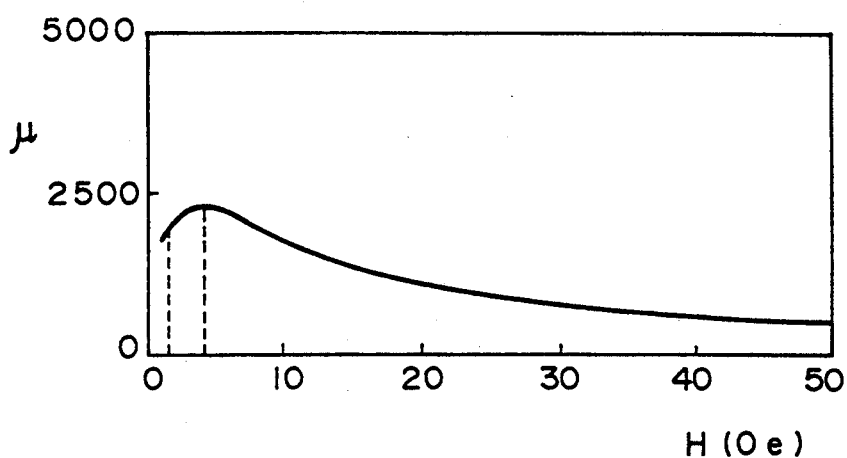
FIG. 8 shows a μ (magnetic permeability) - H curve of the amorphous magnetic film of Experimental Example 1-1.

FIGS. 6 and 7, and 8 show M-H curves and $\mu$ (magnetic permeability) - H curve of the amorphous magnetic film related to the Experimental Example 1-1, respectively. From FIGS. 6 and 7, the coercive force is 1 (Oe), and a maximum magnetic permeability is about 2300 from FIG. 8. It is understood that the film of this example has more improved soft magnetic properties than those of the foregoing basic experimental examples.

Figure 9:
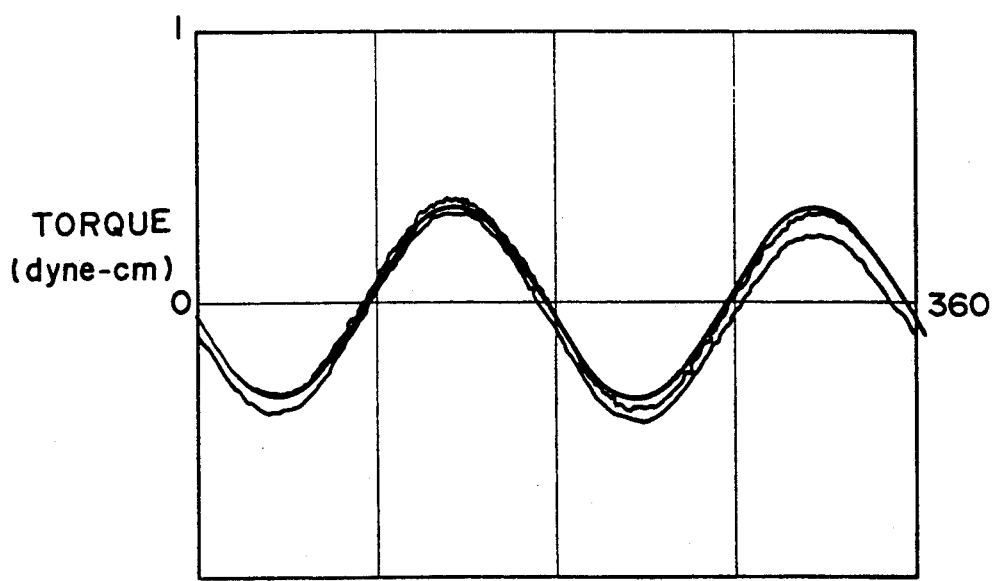
FIG. 9 shows a torque curve of the amorphous magnetic film of Experimental Example 1-1.

The film has a torque curve (magnetic anisotropy curve) as shown in FIG. 9, in which the axis of abscissa corresponds to angles 0° to 360°. The magnetic anisotropy constant Ku (erg/cm$^3$) is a value obtained by dividing the peak absolute value (dyne-cm) of the torque curve by the film volume (cm$^3$).

As shown in FIG. 9, since the peak value is 0.036 (dyne-cm) and the film volume is $2.4 \times 10^{-5}$ (cm$^3$), the magnetic anisotropy is approximately 1500 (erg/cm$^3$). This value is very small compared with approximately 5000 (erg/cm$^3$) of the magnetic anisotropy constant of an amorphous ribbon. The film of this example has very good magnetic properties.

Experimental Example 1-2

Figure 10:
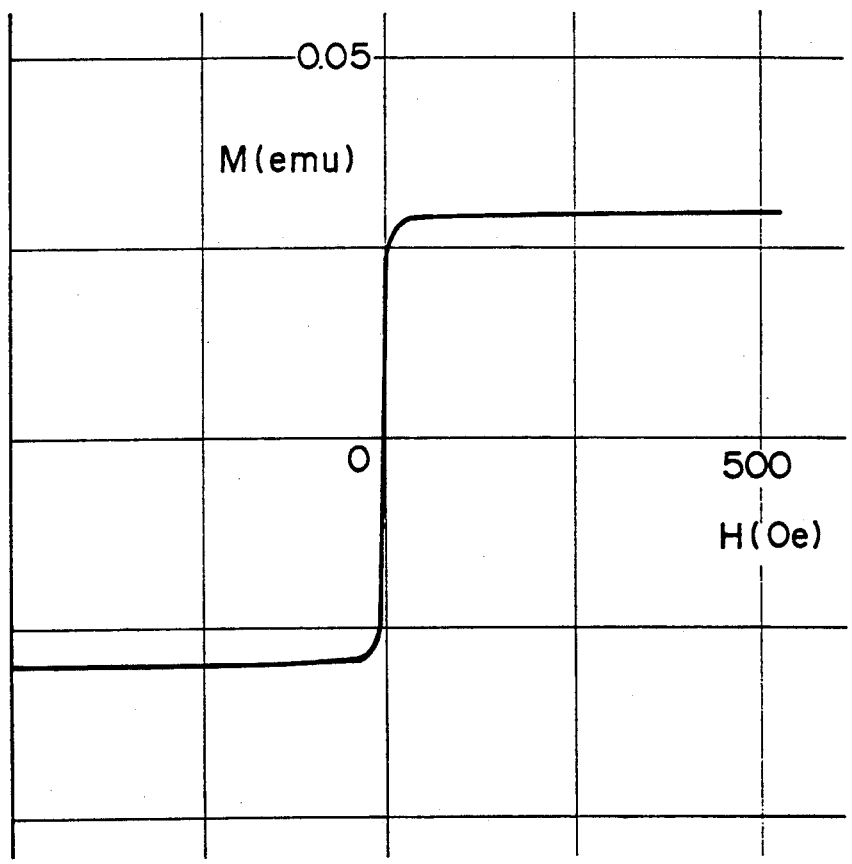
FIG. 10 shows an M-H curve of an amorphous magnetic film of Experimental Example 1-2.
Figure 11:
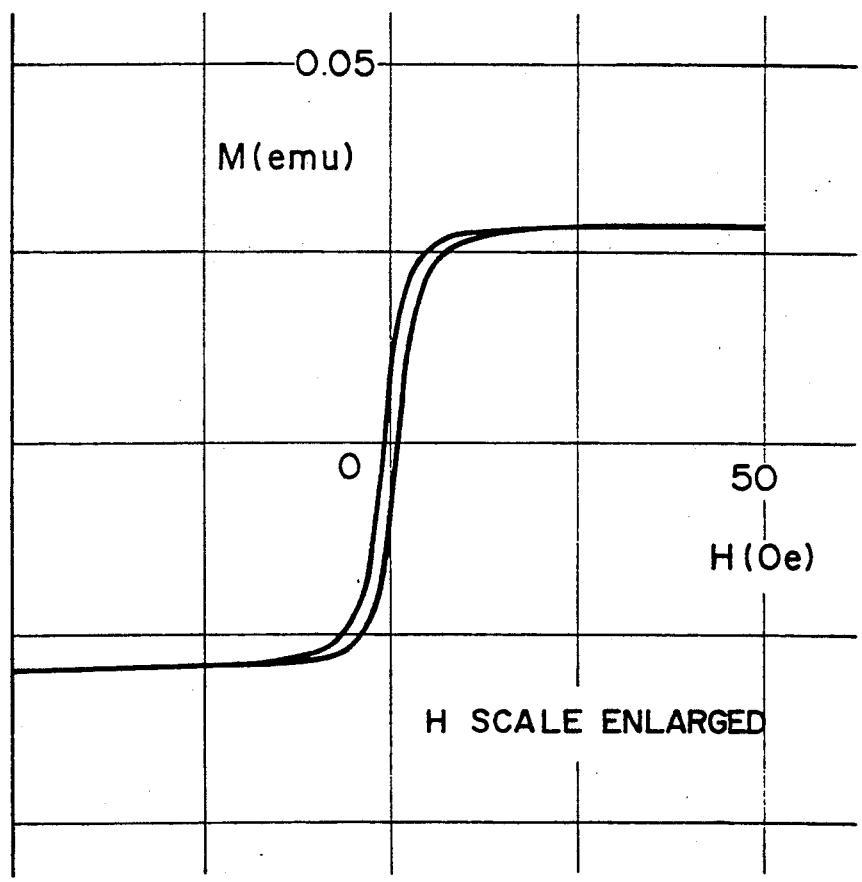
FIG. 11 shows the M-H curve of an amorphous magnetic film of Experimental Example 1-2 (with H scale enlarged)

A voltage was applied so that the target 12 had a potential of 300 V, thereby causing a film to be deposited on the substrate 26 having the room temperature. The film was then annealed in the vacuum chamber for 30 minutes at 300° C. or less below the crystallization temperature of 550° C. FIGS. 10 and 11 show M-H curves of the film thus produced. The other conditions are the same as those for the Experimental Example 1-1. The film was found to have a coercive force of 1 (Oe) and a maximum magnetic permeability of about 2300. In this case, the annealed film shows improved soft magnetic properties. The film has also a broad X-ray diffraction pattern identical to that shown in FIG. 3.

The film has a large adhesion strength, and retains the composition identical to that of the target when analyzed by the XSP.

Figure 12:
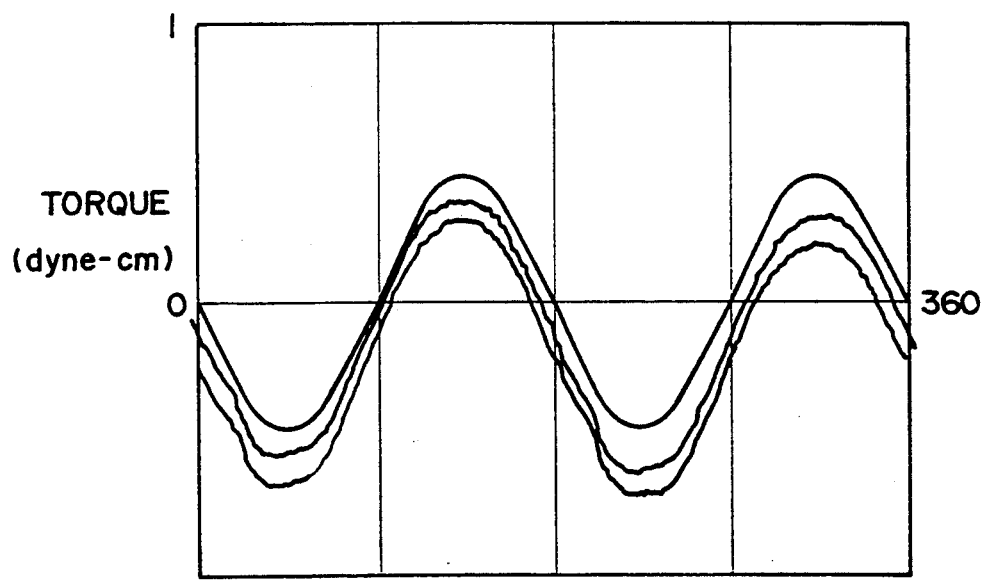
FIG. 12 shows a torque curve of the amorphous magnetic film of Experimental Example 1-2.

A torque curve (magnetic anisotropy curve) of the film is shown in FIG. 12, where the axis of abscissa corresponds to 0° to 360°. The magnetic anisotropy constant Ku (erg/cm$^3$) is a value obtained by dividing the peak absolute value (dyne-cm) of the torque curve by the film volume (cm$^3$).

As shown in FIG. 12, since the peak value is 0.05 (dyne-cm) and the film volume is $3.2 \times 10^{-5}$ (cm$^3$), the magnetic anisotropy is approximately 1600 (erg/cm$^3$). This value is substantially small.

Experimental Example 2-1

A target 12 of $Fe_{75}Si_8B_{17}$ was mounted on the target holder 14 in the chamber 10, which was evacuated to a pressure of $1 \times 10^{-5}$ Torr or less.

The substrate 26 was maintained by the heater 30 at 200° C. below the crystallization temperature of 550° C. The potential of the target holder 14 was set for 0 V. As an evaporating laser beam 16, KrF excimer laser (identical to that of the basic Experimental Example 1) was irradiated for 2,000 seconds to the target 12 rotating at 10 rpm. An irradiating angle was about 45° for the normal of the holder plane, and an irradiating power density was about 10 J/cm$^2$. Thus an amorphous magnetic film was formed on the glass substrate 26.

Figure 13:
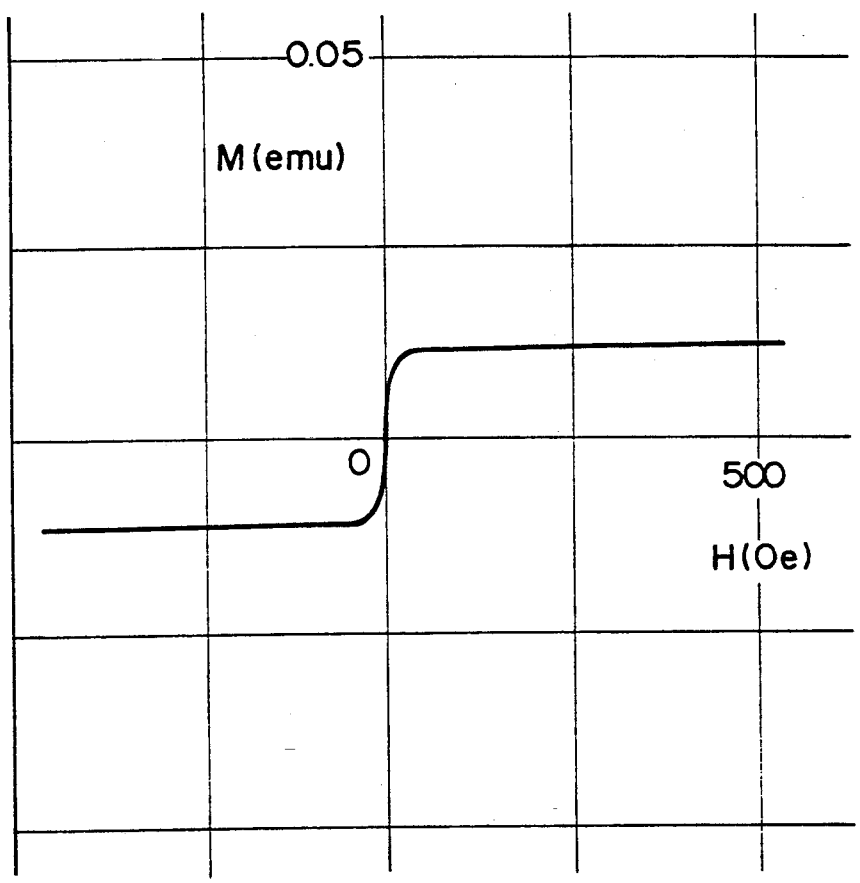
FIG. 13 shows the M-H curve of an amorphous magnetic film of Experimental Example 2-1.

FIG. 13 shows an M-H curve of the amorphous magnetic film of this example. From FIG. 13, a coercive force is 2 (Oe), and a minimum magnetic permeability is approximately 2200. It is understood that the film of this example has more excellent soft magnetic properties than those of the foregoing basic experimental examples.

Figure 14:
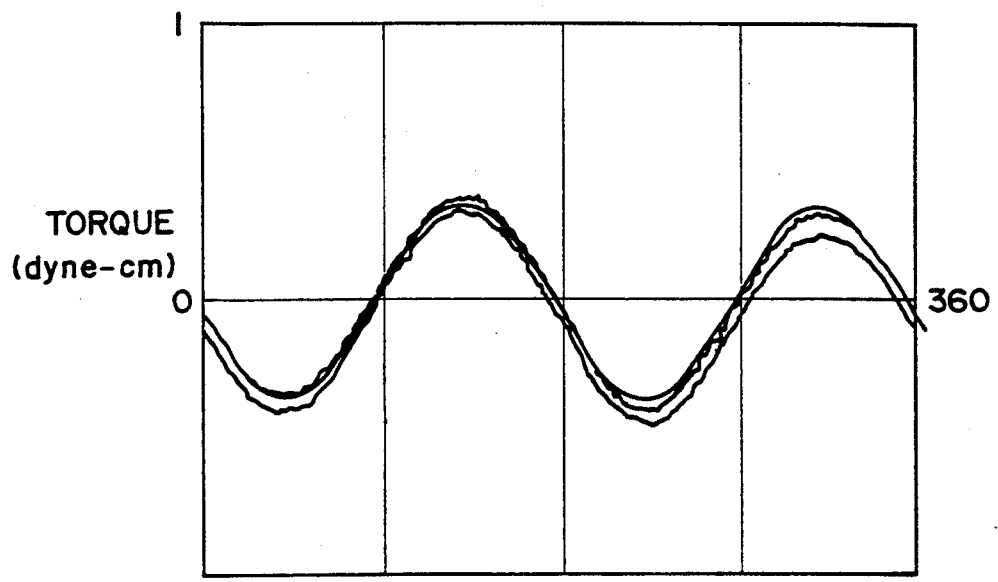
FIG. 14 shows a torque curve of the amorphous magnetic film of Experimental Example 2-1.

The film has a torque curve (magnetic anisotropy curve) as shown in FIG. 14. The magnetic anisotropy constant Ku (erg/cm$^3$) is a value obtained by dividing the peak absolute value (dyne-cm) of the torque curve by the film volume (cm$^3$). As shown in FIG. 14, since the peak value is 0.036 (dyne-cm) and the film volume is $2.6 \times 10^{-5}$ (cm$^3$), the magnetic anisotropy is approximately 1400 (erg/cm$^3$). This value is very small compared with approximately 5000 (erg/cm$^3$) of the magnetic anisotropy of the amorphous ribbon. The film of this example has very good magnetic properties.

Experimental Example 2-2

Figure 15:
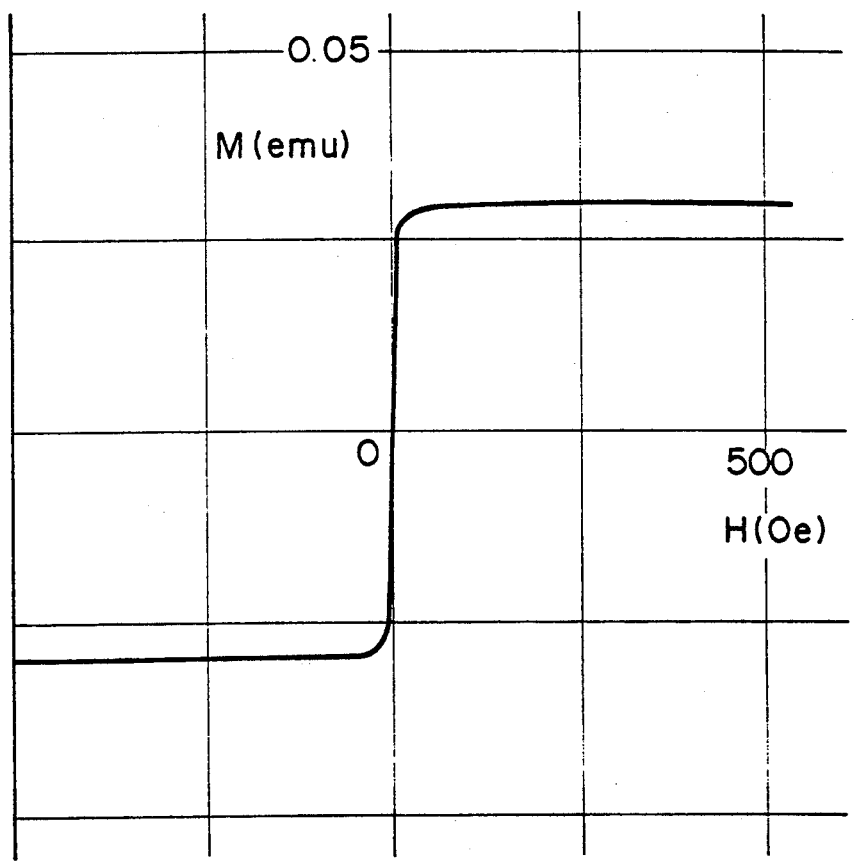
FIG. 15 shows the M-H curve of an amorphous magnetic film of Experimental Example 2-2.
Figure 16:
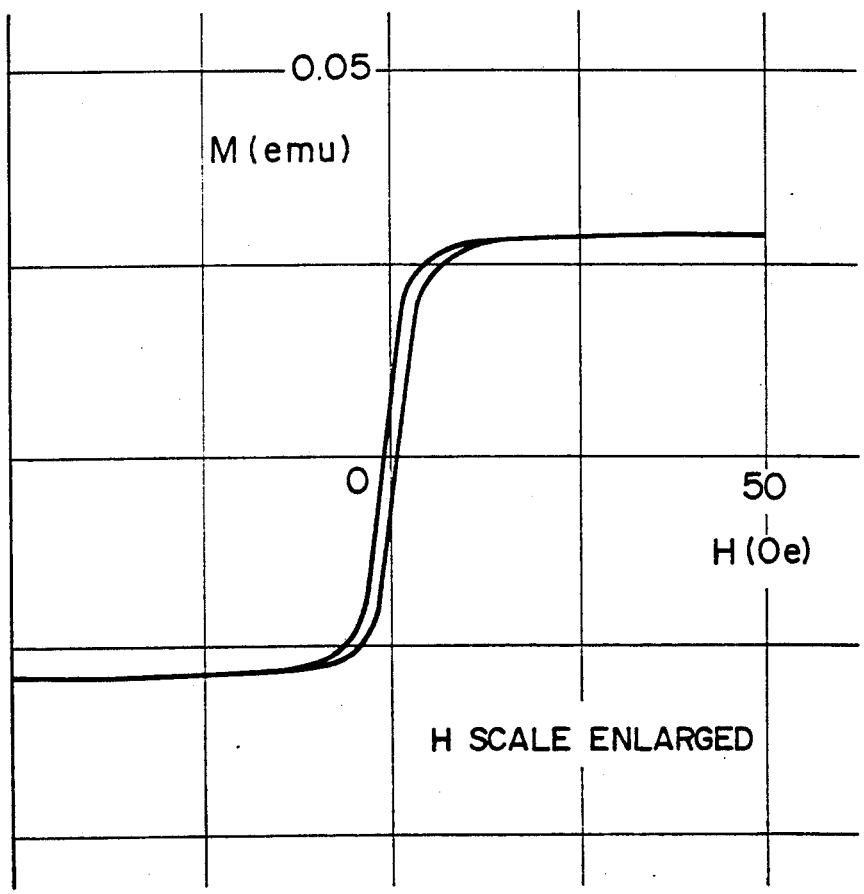
FIG. 16 shows the M-H curve of an amorphous magnetic film of Experimental Example 2-2 (with H scale enlarged)

FIGS. 15 and 16 show M-H curves of a film produced by applying a potential of 300 V to the target holder 14. The other conditions are the same as those of the Experimental Example 2-1. The film has soft magnetic properties such as the coercive force of 1 (Oe) and the maximum magnetic permeability of about 2300. The X-ray diffraction pattern of the film is broad as that shown in FIG. 3.

Figure 17:
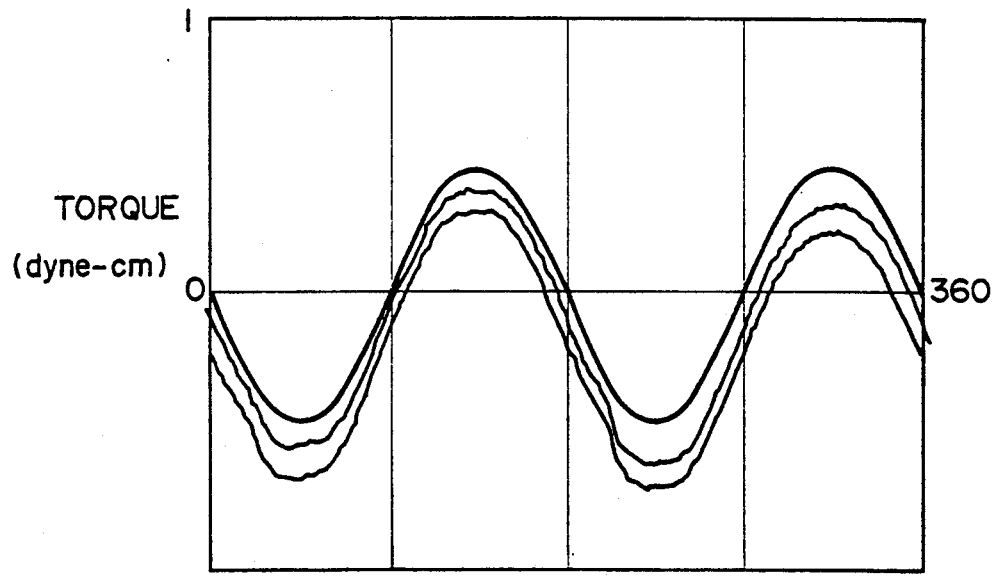
FIG. 17 shows a torque curve of the amorphous magnetic film of Experimental Example 2-2.

The film has a torque curve (magnetic anisotropy curve) as shown in FIG. 17. The magnetic anisotropy constant Ku (erg/cm$^3$) is a value obtained by dividing the peak absolute value (dyne-cm) of the torque curve by the film volume (cm$^3$). As shown in FIG. 5, since the peak value is 0.05 (dyne-cm) and the film volume is $3.4 \times 10^{-5}$ (cm$^3$), the magnetic anisotropy is approximately 1500 (erg/cm$^3$). This value is very small compared with the magnetic anisotropy constant of the amorphous ribbon.

The magnetic properties of the films are improved as described with reference to the Experimental Examples 1 and 2. Specifically, sensitivity of sensors such as torque sensors, which make use of magnetostrictive property, depends upon the magnetic anisotropy. The smaller the magnetic anisotropy, the more sensitive the sensors. A film produced either by the plasma sputtering method or the ion sputtering method has a magnetic anisotropy of about 10,000. From this fact, it can be seen that the film produced by the laser sputtering method has a very small magnetic anisotropy.

Figure 18:
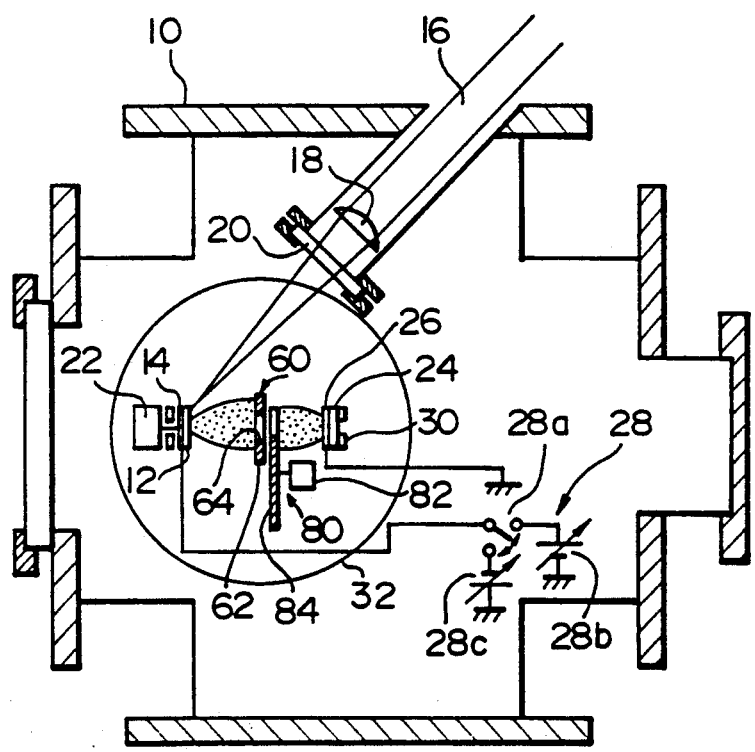
FIG. 18 is a diagrammatical view showing another device for producing an amorphous magnetic film.

FIG. 18 shows another example of a device for producing an amorphous magnetic thin film according to a second method of this invention. With this method, the composition of the film can be controlled strictly as required.

When a target having desired magnetic properties is not available, a target having a composition different from the desired one may be sometimes used.

In this case, a target having a composition easy to make is first provided. Then evaporants from the target are controlled so as to produce a film having the desired composition.

One example of the above two cases will now be described.

In this example, a direction selector 60 and a speed selector 80 are disposed in an evaporant moving path between the target 12 and the substrate 26.

The direction selector 60 has an opening 64 at a predetermined position of a disc 62. The speed selector 80 is a disc 84 which is rotated by a motor 82 at a predetermined speed and has notches having a predetermined angle on the periphery.

With this device, only evaporants emitted from the target 12 in a predetermined direction are selected by the direction selector 60. The evaporants from the target 12 are distributed spatially according to their kinds (atomic volume, for example). Therefore, only the desired evaporants can be deposited on the substrate 26 according to the position of the direction selector 60, thereby controlling the composition of the film.

In addition, the speed selector 80 selects only the evaporants passing therethrough in a predetermined period of time after irradiation of the laser pulses.

The evaporants from the target 12 have speeds depending upon their components (for example, heavy evaporants are slow). Therefore, the evaporants are distributed according to their speeds. The speed selector 80 selects only the evaporants having the desired speed component so that a film having the desired composition can be formed on the substrate 26.

According to this invention, it is possible to establish conditions for producing evaporated films precisely according to selection of evaporants having a desired speed. In addition, it is possible to control the composition of the amorphous magnetic films extensively.

As described so far, this invention is very effective to produce amorphous magnetic films which are very pure, having compositions identical to those of targets and a very large adhesion strength. Specifically the magnetic properties of the films can be improved by the annealing process. The films thus produced are optimum as materials for torque sensors or pressure sensors for measuring distortions at thin film forming sections (by use of magnetostrictive effect).

When an optimum composition is known beforehand according to the use of films, the amorphous magnetic films can be produced easily and effectively compared with the films produced by the conventional methods.

The film is not heated during its production as in the case with the sputtering method. This feature is very advantageous. The conditions for heating the film to eliminate stresses can be established as desired, enabling production of more excellent magnetic soft films.

What is claimed is:

1. A method of producing an amorphous magnetic film, comprising:
    (a) disposing a target consisting of a magnetic metal and a substrate in a confronting manner in a high vacuum chamber;
    (b) heating said substrate to a temperature below a crystallization temperature of a film to be produced;
    (c) irradiating a laser beam to said target so as to evaporate a target material; and
    (c) depositing the evaporated target material on said heated substrate so as to produce a thin film on said substrate.

2. A method according to claim 1, further including applying a potential between said target and said substrate.

3. A method according to claim 1, wherein said magnetic metal is $Se_{75}Si_8B_{17}$, said laser beam is a KrF excimer laser whose irradiation power density is approximately 10 J/cm$^2$ on the surface of said target, and the temperature of the substrate is 550° C. or less.

4. A method according to claim 2, wherein said magnetic metal is $Fe_{75}Si_8B_{17}$, said laser beam is a KrF excimer laser whose irradiation power density is approximately 10 J/cm$^2$ on the surface of said target, and the temperature of the substrate is 200° C. or less.

* * * * *